United States Patent
Murofushi et al.

(10) Patent No.: US 7,498,609 B2
(45) Date of Patent: Mar. 3, 2009

(54) LIGHT-EMITTING SEMICONDUCTOR DEVICE OF IMPROVED EFFICIENCY

(75) Inventors: Hitoshi Murofushi, Niiza (JP); Hidekazu Aoyagi, Niiza (JP); Shiro Takeda, Niiza (JP); Yoshihiko Uchida, Niiza (JP)

(73) Assignee: Sanken Electric Co., Ltd. (JP)

( * ) Notice: Subject to any disclaimer, the term of this patent is extended or adjusted under 35 U.S.C. 154(b) by 301 days.

(21) Appl. No.: 11/222,369

(22) Filed: Sep. 8, 2005

(65) Prior Publication Data

US 2006/0001032 A1  Jan. 5, 2006

Related U.S. Application Data

(63) Continuation of application No. PCT/JP2004/002834, filed on Mar. 5, 2004.

(30) Foreign Application Priority Data

Mar. 10, 2003  (JP) .............................. 2003-063198

(51) Int. Cl.
*H01L 27/15* (2006.01)
(52) U.S. Cl. ................................. 257/99; 257/E33.062
(58) Field of Classification Search .................... 257/99
See application file for complete search history.

(56) References Cited

U.S. PATENT DOCUMENTS

2003/0111667 A1* 6/2003 Schubert ...................... 257/98

FOREIGN PATENT DOCUMENTS

| JP | 11-145520 | 5/1999 |
| JP | 11-163402 | 6/1999 |
| JP | 2001-291896 | 10/2001 |
| JP | 2002-217450 | 8/2002 |

OTHER PUBLICATIONS

Baca et al. "A Survey of ohmic contacts III-V compound semiconductors," Thin Solid Films 308-309, 599-606, 1997.*

* cited by examiner

*Primary Examiner*—Jack Chen
*Assistant Examiner*—Matthew Reames
(74) *Attorney, Agent, or Firm*—Woodcock Washburn LLP (57) ABSTRACT

An LED comprises a semiconductor region including an active layer for generating light. An anode is arranged centrally on one of the opposite major surfaces of the semiconductor region from which is emitted the light. A reflective metal layer is bonded to the other major surface of the light-generating semiconductor region via an ohmic contact layer. Sufficiently thin to permit the passage of light therethrough, the ohmic contact layer is formed in an open-worked pattern to leave exposed part of the second major surface of the semiconductor region. A transparent, open-worked anti-alloying layer is interposed between the light-generating semiconductor region and the reflective metal layer, covering that part of the second major surface of the light-generating semiconductor region which is left exposed by the ohmic contact layer. The anti-alloying layer prevents the light-generating semiconductor region and reflective metal layer from alloying during heat treatments conducted in the curse of LED manufacture. A greater percentage of the light from the light-generating semiconductor region is reflected by the reflective metal layer for emission from the first major surface of the light-generating semiconductor region than in the absence of the anti-alloying layer.

12 Claims, 4 Drawing Sheets

LIGHT-EMITTING SEMICONDUCTOR DEVICE OF IMPROVED EFFICIENCY

CROSS REFERNCE TO RELATED APPLICATIONS

This is a continuation of Application PCT/JP2004/002834, filed Mar. 5, 2004, which claims priority to Japanese Patent Application No. 2003-063198 filed Mar. 10, 2003.

BACKGROUND OF THE INVENTION

This invention relates to a light-emitting semiconductor device, or light-emitting diode (LED) according to more common parlance, and more particularly to high-efficiency light-emitting devices having active layers made from semiconducting chemical compounds such for example as aluminum gallium arsenide (AlGaAs), aluminum gallium indium phosphide (AlGaInP), gallium nitride (GaN), and derivatives thereof. The invention also concerns a method of making such light-emitting semiconductor devices.

A typical conventional light-emitting semiconductor device has a substrate of gallium arsenide (GaAs) on which there are successively grown a set of semiconductor layers including light-generating active layers. These active and associated semiconductor layers, hereinafter collectively referred to as the light-generating semiconductor layers, are each composed principally from AlGaInP. Comparatively well lattice matched with the GaAs substrate, the AlGaInP-based light-generating semiconductor layers are favorable in crystallinity.

There does, however, exist a crucial drawback to the GaAs substrate: It is highly absorptive of the light of the particular wavelength range produced by the AlGaInP-based active layers. Much of the light radiated toward the GaAs substrate from the active layers was therefore wasted, running counter to the objective of making the light-emitting device as high in efficiency as could be desired.

A known remedy to this problem was to remove the GaAs substrate from under the light-generating semiconductor layers after epitaxially growing these layers thereon. A transparent baseplate of gallium phosphide (GaP) or the like, different from the removed substrate which had been used for epitaxial growth of the light-generating semiconductor layers thereon, was then bonded to the underside of these semiconductor layers. Then a reflective electrode was formed under the baseplate. This remedy proved unsatisfactory, however, as the light-generating semiconductor layers and the transparent baseplate gave rise to high electrical resistance at the interface therebetween. This resistance made the forward voltage between the anode and cathode of the light-emitting device inconveniently high.

A solution to this weakness of the known remedy is found in Japanese Unexamined Patent Publication No. 2002-217450 filed by the applicant of the instant U.S. application. This prior patent application teaches the creation of a thin, open-worked layer of gold—germanium—gallium (Au—Ge—Ga) alloy on the underside of the light-generating semiconductor layers. The open-worked Au—Ge—Ga alloy layer, as well as those surface parts of the overlying light-generating semiconductor layers which are left exposed by this open-worked alloy layer, is then covered with a layer of aluminum or like reflective metal. To this reflective metal layer is then bonded a baseplate, or mechanical support, of electrically conductive silicon or like material.

The Au—Ge—Ga alloy layer is known to make favorable ohmic contact with AlGaInP-based light-generating semiconductor layers, so that it can reduce the forward voltage between anode and cathode. The efficiency of light emission is also enhanced as the reflective metal layer reflects the light that has been radiated toward the baseplate.

However, this second recited prior art device also proved to have its own weaknesses. One of these weaknesses arose in the course of the manufacturing process of the device, which involved several heat treatments. Undesired reactions took place as a result of such heat treatments between the reflective metal layer and the neighboring parts of the light-generating semiconductor layers. The result was a diminution of reflectivity at their interface. The light-emitting devices actually manufactured according to this prior art were therefore not necessarily so high in efficiency as had been expected.

SUMMARY OF THE INVENTION

The present invention has it as an object to improve the efficiency of light-emitting semiconductor devices of the kind defined, without the difficulties encountered heretofore.

Stated briefly in one aspect thereof, the present invention provides a light-emitting semiconductor device comprising a light-generating semiconductor region having a plurality of compound semiconductor layers for generating light. An electrode is formed on a first major surfaces of the light-generating semiconductor region from which is emitted the light. Formed on a second major surface, opposite to the first major surface, of the light-generating semiconductor region is an ohmic contact layer which is open-worked to leave exposed part of the second major surface. A reflective metal layer covers the second major surface of the light-generating semiconductor region via the ohmic contact layer for reflecting the light from the light-generating semiconductor region toward the first major surface thereof. The invention particularly features a transparent, open-worked anti-alloying layer interposed between the light-generating semiconductor region and the reflective metal layer so as to cover at least part of that part of the second major surface of the light-generating semiconductor region which is left exposed by the ohmic contact layer, in order to prevent the alloying of the light-generating semiconductor region and the reflective metal layer.

The light-emitting semiconductor device broadly outlined above may be either finished or unfinished. The invention is understood to cover not just completed products but half-complete ones such as those commonly called chips.

In a preferred embodiment to be disclosed subsequently, the ohmic contact layer takes the form of an array of discrete island-like regions (hence the term "open-worked") on the second major surface of the light-generating semiconductor region. The anti-alloying layer on the other hand is lattice shaped (again the term "open-worked"), covering that part of the second major surface of the light-generating semiconductor region which is left exposed by the arrayed regions of the ohmic contact layer.

Also in the preferred embodiment the second major surface of the light-generating semiconductor region is defined by an n-type cladding of the active layer. The n-type cladding is made from a gallium-containing compound semiconductor. Interposed between this n-type cladding and the reflective metal layer of aluminum or the like, the anti-alloying layer according to the invention, which may be of silicon dioxide, functions to prevent the undesired alloying of these gallium-containing compound semiconductor layer of the light-generating semiconductor region and the reflective metal layer in the face of various heat treatments to be conducted in the course of the manufacture of the light-emitting device. The reflective metal layer of the completed product will therefore be just as reflective as it was designed to be, so that the light from the light-generating semiconductor region is to be reflected by the reflective metal layer in greater percentage than in the absence of the anti-alloying layer. The light thus reflected is to issue from the first major surface of the light-generating semiconductor region together with the light that has been directly radiated toward the first major surface from the source.

It is recommended that the open-worked ohmic contact layer, which makes ohmic contact with both the n-type cladding of the light-generating semiconductor region and the reflective metal layer, be made from an alloy of gallium and another metal such as gold. The ohmic contact layer of such an alloy is less absorptive of light than its conventional counterpart of Au—Ge—Ga alloy. A correspondingly greater proportion of the light that has impinged on the ohmic contact layer from the light-generating semiconductor region will therefore be reflected toward the light-emitting first major surface of the region, instead of being absorbed and wasted.

The preferred thickness of the Ga—Au ohmic contact layer is from 20 to 1000 angstroms. Below the lower limit of this thickness range the ohmic contact layer might fail to make favorable ohmic contact. Above the upper limit, on the other hand, the ohmic contact layer would be too non-transmissive of light. The ohmic contact layer of this thickness range will permit the passage of a fraction of the incident light therethrough for reflection by the reflective metal layer. The reflected light will issue from the light-emitting second major surface of the semiconductor region as effective part of the total optical output of the device, making an appreciable contribution to the improvement of its efficiency.

If the output intensity of the device is to remain the same as hitherto, the ohmic contact layer may be made larger in area to an extent corresponding to the increase in the amount of reflection at the interface between the reflective metal layer and the open-worked ohmic contact layer. In other words, the ohmic contact layer may be enlarged in area without causing a decrease in output light intensity. Such a larger ohmic contact layer offers the advantages of less resistance to current flow for light emission, less forward voltage, less power loss, and, ultimately, higher efficiency.

Another aspect of the invention concerns a method of making a light-emitting semiconductor device of the above summarized construction. There is first prepared the light-generating semiconductor region of the foregoing configuration. Then the transparent, open-worked anti-alloying layer is formed on the second major surface of the light-generating semiconductor region. Then the open-worked ohmic contact layer is formed on that part of the second major surface of the light-generating semiconductor region which is left exposed by the anti-alloying layer. Then the reflective metal layer is formed so as to cover the second major surface of the light-generating semiconductor region via the anti-alloying layer and the ohmic contact layer.

The invention teaches a special method for creation of the ohmic contact layer following that of the open-worked anti-alloying layer on the second major surface of the light-generating semiconductor region. A transition metal layer and diffusible metal layer may be formed one after the other on that part of the second major surface of the semiconductor region which is left exposed by the anti-alloying layer. The diffusible metal layer is of a metal that is thermally diffusible into the gallium-containing semiconductor layer of the semiconductor region via the transition metal layer. Then the article is heated at less than the eutectic temperature of the gallium-containing semiconductor and the diffusible metal, thereby causing the diffusible metal to diffuse into the gallium-containing semiconductor layer, with the consequent creation of the open-worked ohmic contact layer of the alloyed metals.

In the preferred embodiment the transition metal layer is of chromium, and the diffusible metal layer is of gold. The transition metal layer serves the dual purpose of causing solid-phase decomposition of the elements constituting the compound semiconductor layer and cleansing the semiconductor surface. Therefore, by heating the article at a temperature as low as below the eutectic point of gallium and gold, the gold can be dispersed in solid phase into the gallium-containing semiconductor layer for creation of the Ga—Au alloy ohmic contact layer. The ohmic contact layer thus obtained is free from germanium or other metals that tend to cause liquefaction of the reflective metal layer for undesired alloying with the semiconductor layer.

This method is preferred for the ease with which the ohmic contact layer is fabricated to a desired minimal thickness. All that is necessary for this purpose is to determine the temperature and length of time of the heating so as to limit the thickness of the resulting ohmic contact layer to the desired range of 20 to 1000 angstroms. It is important that the temperature be made less than the eutectic point of gallium and gold in order to obtain an ohmic contact layer of unvarying thickness and low resistance.

The above and other objects, features and advantages of this invention will become more apparent, and the invention itself will best be understood, from a study of the following description and appended claims, with reference had to the attached drawings showing the preferred embodiments of the invention.

DETAILED DESCRIPTION

Figure 1:
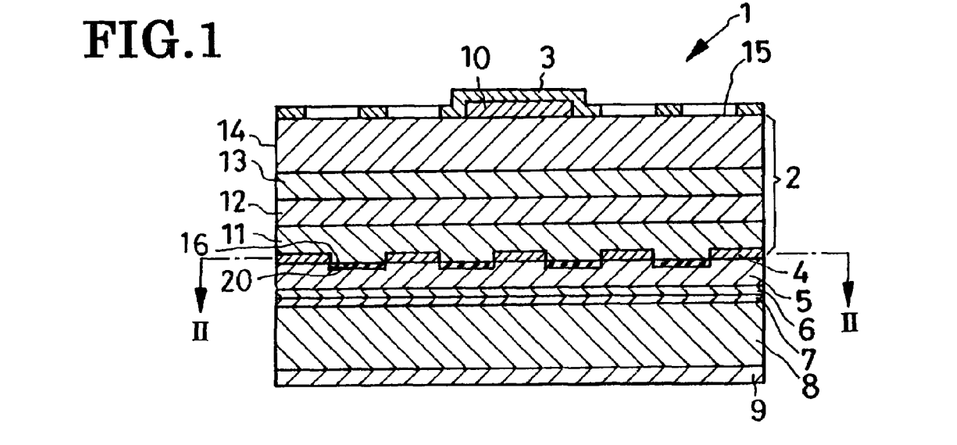
FIG. 1 is a cross section through an LED embodying the principles of this invention.
Figure 2:
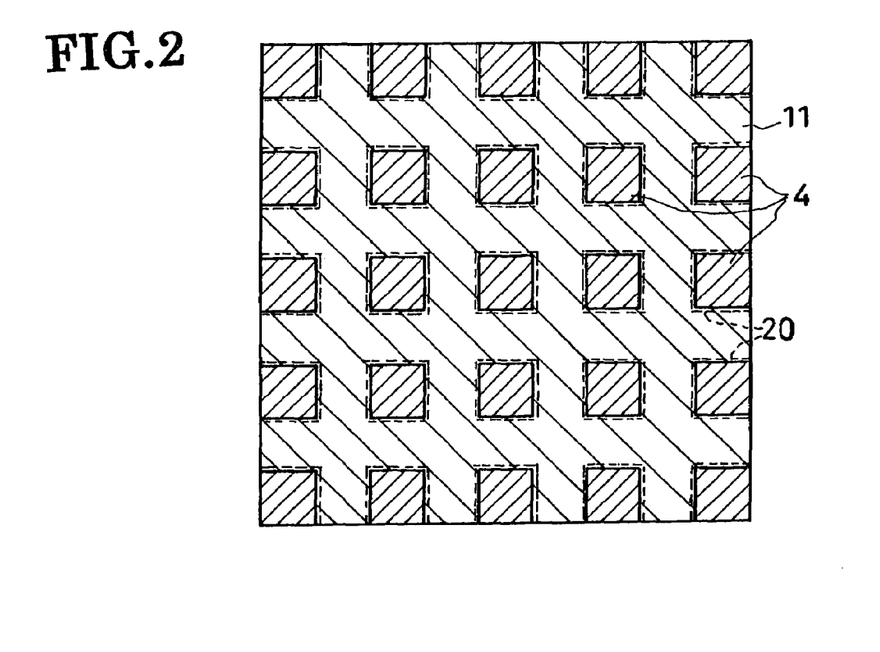
FIG. 2 is a transverse section through the LED, taken along the line II-II in FIG. 1.

The present invention is currently believed to be best embodied in the LED 1 depicted cross-sectionally in FIG. 1 and in a transverse section in FIG. 2. The exemplified LED 1 has a light-generating semiconductor region 2 which is composed of several laminated layers capable of glowing upon voltage application, as will be detailed shortly. An anode 3 overlies the light-generating semiconductor region 2 via a current-blocking layer 10. Under this light-generating semiconductor region 2, on the other hand, there are provided an open-worked ohmic contact layer 4, another open-worked, transparent anti-alloying layer 20 constituting a feature of this invention, a reflective metal layer 5, two bonding metal layers 6 and 7, a baseplate 8 of electrically conducting silicon, and a cathode 9, in that order from the bottom of the light-generating region 2 downward as viewed in FIG. 1.

Figure 3A:
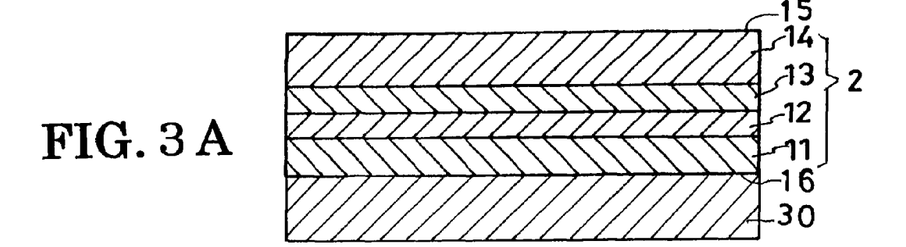
FIG. 3A is a cross section through the light-generating semiconductor region of the LED, shown together with the substrate on which it has been grown, by way of a first step for fabricating the LED of FIG. 1 by the method of this invention.
Figure 3B:
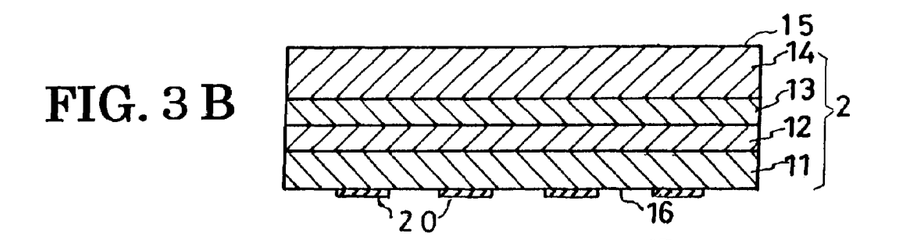
FIG. 3B is a view similar to FIG. 3A except that the substrate is not shown, having been removed from the semiconductor region following the completion of its growth, and that the open-worked anti-alloying layer is formed on the now-exposed second major surface of the semiconductor region.

The light-generating semiconductor region 2 is a lamination of an n-type compound semiconductor layer or cladding 11, an active layer 12, a p-type compound semiconductor layer or cladding 13, and a p-type compound semiconductor current-spreading layer 14, grown epitaxially in that order on a substrate seen at 30 in FIG. 3A. (The substrate 30 is unseen in FIG. 1 because it is removed from under the light-generating semiconductor region 2 following the epitaxial growth of the layers 11-14 thereon.) Strictly speaking, the term "light-generating" might be applied only to the active layer 12 or, more loosely, to the active layer 12 together with its claddings 11 and 13 of the opposite conductivity types. The light-generating semiconductor region 2 as a whole has a pair of opposite major surfaces 15 and 16. The light issues from the major surface 15.

The n-type cladding 11 are fabricated from Group III-V compound semiconductors that are generally defined as:

where the subscript x is a numeral equal to or greater than zero and less than one; the subscript y is a numeral greater than zero and equal to or less than one; and the sum of x and y is greater than zero and equal to or less than one. An n-type substance such as silicon may be doped to any selected one of these compound semiconductors.

The aluminum proportion x of the above defined compound semiconductors for the n-type cladding 11 is preferably from 0.15 to 0.45 and most desirably from 0.2 to 0.4. The gallium proportion y is preferably from 0.15 to 0.35 and most desirably from 0.4 to 0.6. The above defied materials employable for the n-type cladding 11 may be restated as necessarily containing gallium and phosphorus and optically containing indium. The n-type impurity added to the n-type cladding 11 is not less than $5\times10^{17}$ cm$^{-3}$ in concentration. The gallium content of the n-type cladding 11 is conducive to the creation of the open-worked ohmic contact layer 4.

As required or desired, an n-type contact layer may be provided under the n-type cladding 11. Such a contact layer can be made from Group III-V compound semiconductors that are generally expressed as $Al_xGa_yIn_{1-x-y}P$. Although the formula is the same for the materials for both n-type cladding 11 and unshown n-type contact layer, exact compositions may differ.

Overlying the n-type cladding 11, the active layer 12 is made from any of p-type Group III-V compound semiconductors that are generally expressed as:

where the subscripts x and y are both numerals equal to or greater than zero and equal to or less than one, and the sum of x and y is equal to or greater than zero and equal to or less than one.

A p-type impurity may be doped to the active layer 12 to a concentration less than that in the p-type cladding 13 to be detailed presently. Alternatively, however, an n-type impurity may be added to the active layer 12, or no conductivity-type determinant may be introduced at all. A single active layer is shown in FIG. 1 because the light-generating semiconductor region 2 depicted here is of the double heterojunction configuration consisting of one n-type cladding 11, one active layer 12 and one n-type cladding 13. In practice the active layer may take the form of either multiple or single quantum well structure.

The p-type cladding 13 over the active layer 12 may be of any of the p-type Group III-V compound semiconductors that are generally defined as:

where the subscripts x and y are both numerals equal to or greater than zero and equal to or less than one, and the sum of x and y is equal to or greater than zero and equal to or less than one. The aluminum proportion x may be from 0.15 to 0.50 for the best results. Zinc or like p-type impurity may be added to a concentration of $5\times10^{17}$ cm$^{-3}$ or more.

The current-spreading layer 14 over the p-type cladding 13 serves primarily for uniformity of forward current distribution. Additionally, it serves for making ohmic contact with the anode 3 and for unimpeded emission of the light from the active layer 12. The current-spreading layer 14 may be made from any such p-type Group III-V compound semiconductors as GaP, $Ga_xIn_{1-x}P$ and $Al_xGa_{1-x}As$. The p-type impurity content of this current-spreading layer 14 is higher in concentration than that of the p-type cladding 13. A p-type contact layer, not shown, of a p-type compound semiconductor could be provided on the current-spreading layer 14.

Placed centrally on the current-spreading layer 14, the current-blocking layer 10 is of electrically insulating material. It functions to prevent a concentrated flow of forward current through the central part of the light-generating semiconductor region 2.

The anode 3 overlying both current-blocking layer 10 and current-spreading layer 14, making ohmic contact with the latter, may be a lamination of chromium and gold layers. The anode 3 is open-worked for uniform forward current flow, as by being latticed or meshed as seen normal to the major surface 15 of the light-generating semiconductor region 2. The anode 3 could be made transparent.

The open-worked ohmic contact layer 4 on the other major surface 16 of the light-generating semiconductor region 2 is shown in FIG. 2 as an array of thin, isolated regions embedded in the n-type cladding 11. The major surface of the semiconductor region 2 may therefore be described as being constituted of both the open-worked ohmic contact layer 4 and the n-type cladding 11.

The constituent regions of the ohmic contact layer 4 are all fabricated from an alloy or mixture of gallium and gold, making ohmic contact with the overlying n-type cladding 11 and underlying reflective layer 5. The Ga—Au alloy ohmic contact layer 4 may range from 20 to 1000 angstroms in thickness. The ohmic contact layer 4 would not make good ohmic contact if it were less than 20 angstroms thick, and would be too poor in transparency if it were 1000 angstroms thick.

Made from Au—Ga alloy as above, the open-worked ohmic contact layer 4 is less absorptive of light, and more transmissive of light, than the Au—Ge—Ga alloy layer of Japanese Unexamined Patent Application No. 2002-217450, supra. This prior art alloy layer absorbs and attenuates most of the incident light due in part to its germanium content (germanium is highly opaque) and in part to its thickness of 2000 angstroms or more. The open-worked ohmic contact layer of Au—Ga alloy according to the instant invention is far more transmissive of light by virtue of its non-germanium content and reduced thickness of 20-1000 angstroms. (The terms such as "absorptive", "transmissive" and "reflective" are being used here with respect to the light of the particular wavelength range generated by the active layer 12.)

The surface of the n-type cladding 11 (i.e., the major surface 16 of the light-generating semiconductor region 2) is covered by the reflective metal layer 5 via the open-worked ohmic contact layer 4 and open-worked, transparent anti-alloying layer 20. The anti-alloying layer 20 of electrically insulating material is interposed between reflective metal layer 5 and n-type cladding 11 in order to prevent the alloying of the metals forming these neighboring layers. The reflective metal layer 5 is thus to remain as reflective as desired even after the thermal treatments to be applied to the LED 1 in the course of manufacture.

It is understood that the reflective metal layer 5 is more reflective than the interface between ohmic contact layer 4 and n-type cladding 11. Part of the light that has been radiated from the active layer 12 toward the major surface 16 of the light-generating semiconductor region 2 will traverse the anti-alloying layer 20 and be reflected by the reflective metal layer 5 back toward the other major surface 15 of the light-generating semiconductor region. Should the reflective metal layer 5 be in direct contact with the n-type cladding 11, as was the case with the aforesaid Japanese unexamined patent application, a light-absorptive layer would be created between the two contacting layers as a result of the thermal treatments during manufacture. The result would be a drop in the reflectivity of the reflective metal layer 5.

By contrast, according to this invention, no such light-absorptive layer will be thermally formed between reflective metal layer 5 and n-type cladding 11 thanks to the provision of the anti-alloying layer 20. Experiment has proved that the anti-alloying layer 20 according to the invention makes the reflective metal layer 5 approximately twenty percent more reflective than its prior art counterpart furnished with no such anti-alloying layer. A correspondingly greater percentage of the light that has impinged upon the reflective metal layer 5 via the anti-alloying layer 20 is therefore reflected back for emission from the major surface 15 of the light-generating semiconductor region 2, making an apparently noticeable contribution to the higher efficiency of the LED 1.

Additionally, by virtue of the noted germanium-free composition of the open-worked ohmic contact layer 4 and the reduced thickness (20-1000 angstroms) of this layer, part of the light incident thereon from the light-generating semiconductor region 2 will travel therethrough to be reflected by the reflective metal layer 5. This light fraction will also issue from the major surface 15 of the light-generating semiconductor region 2. The combination of the ohmic contact layer 4 and reflective metal layer 5 according to the invention is therefore higher in reflectivity than the combination of their prior art counterparts.

As will be better understood by referring to FIGS. 1 and 2 again, the ohmic contact layer 4 and anti-alloying layer 20 are both open-worked. The reflective metal layer 5 is therefore overlaid in part by the ohmic contact layer 4 and in part by the anti-alloying layer 20. Improvement in reflectivity is accomplished in both parts of the reflective metal layer 5. Hence the higher efficiency of the LED 1.

The anti-alloying layer 20 is shown to be latticed or meshed in this embodiment of the invention by way of example only. It could take the form of an array of isolated regions like the ohmic contact layer 4, or of parallel stripes, all that is required being that it be open-worked. The anti-alloying layer 20 should be made from materials such that the resulting layer effectively prevents the alloying of the light-generating semiconductor region 2 and reflective metal layer 5 and transmits the light from the active layer 12.

A preferred material meeting the above requirements is silicon oxide. Speaking more broadly, the anti-alloying layer 20 may be made from one or more of such inorganic oxides as silicon dioxide ($SiO_2$), silicon monoxide (SiO), magnesium oxide (MgO), indium oxide ($In_2O_3$), zirconium oxide ($ZrO_2$), stannic oxide ($SnO_2$), aluminum oxide ($Al_2O_3$), titanium oxide ($TiO_2$), zinc oxide (ZnO), and tantalum oxide (TaO). A transparent polyimide resin is also adoptable.

The anti-alloying layer 20 is more transmissive of the light from the active layer 12 than the ohmic contact layer 4. This layer 20 should moreover be sufficiently thick (e.g. from three nanometers to one micrometer) to prevent the alloying of the neighboring layers, as has been stated. It is also desired to provide a quantum-mechanical tunnel effect, so that it may preferably be from three to ten nanometers thick in order to meet these requirements.

The reflective metal layer 5 is bonded to the electroconductive silicon baseplate 8 via the bonding metal layers 6 and 7 which are made from gold. The bonding metal layer 6 covers the entire bottom surface of the reflective metal 5 whereas the other bonding metal layer 7 covers the entire top surface of the baseplate 8. The two bonding metal layers 6 and 7 are bonded to each other under heat and pressure.

Made from doped silicon, the electroconductive baseplate 8 serves the triple purpose of providing a mechanical support for the LED 1, radiating heat, and providing a current path.

The cathode 9 underlies the entire surface of the baseplate 8. This cathode will be unnecessary in cases where the silicon baseplate 8 is replaced by a metal-made one.

Method of Manufacture

FIGS. 3-8 are illustrations of successive steps in the fabrication of the LED 1 according to this invention. The fabrication of the LED 1 started with the preparation of a semiconductor substrate of GaAs 10 shown at 30 in FIG. 3(A). The light-generating semiconductor region 2 was formed on this GaAs substrate 10 by successively growing by epitaxy the n-type cladding 11, active layer 12, p-type cladding 13, and current-spreading layer 14, all using the familiar apparatus for metal organic chemical vapor deposition (MOCVD). Wholly made from compound semiconductors, the light-generating semiconductor region 2 could be grown on the compound semiconductor substrate 30 with little or no dislocations or other defects.

The light-generating semiconductor region 2 having been grown thereon, the substrate 30 was no longer necessary. This substrate was therefore removed from under the n-type cladding 11, exposing the major surface 16 of the light-generating semiconductor region 2. Notwithstanding the showing of FIG. 3(A), however, the growth of the light-generating semiconductor region 2 on the substrate 30 in the order of the layers 11 to 14 was not an absolute necessity; instead, the region 2 could be grown in the reverse order. The substrate might then be removed from over the current-spreading layer 14 at a later stage, rather than immediately after the growth of the light-generating semiconductor region 2.

The next step was the creation of the latticed light-transmissive layer 20 of electrically insulating material on the now-exposed, major surface 16 of the light-generating semiconductor region 2. A silicon oxide film was first formed on the entire surface 16 by sputtering, although other known methods such as plasma chemical vapor deposition could have been employed as well. Then this film was photolithographically reshaped into the latticed anti-alloying layer 20, FIG. 3(B), which left exposed parts of the major surface 16 of the light-generating semiconductor region 2 in an array.

Figure 4:
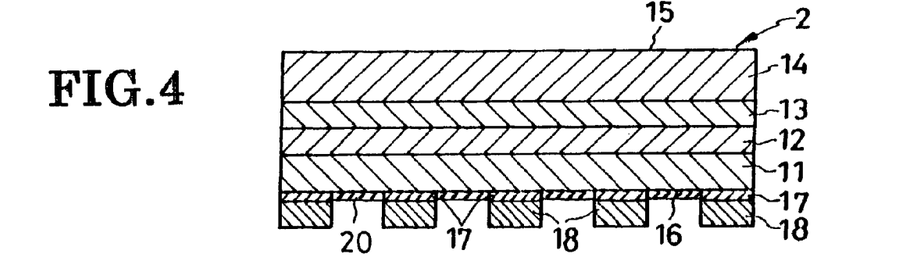
FIG. 4 is a view similar to FIG. 3B but additionally showing a transition metal layer and diffusible metal layer formed in those parts of the second major surface of the light-generating semiconductor region which has been left exposed by the anti-alloying layer.

Then, on these exposed surface parts of the light-generating semiconductor region 2, a transition metal layer and diffusible metal layer were successively layered by vacuum vapor deposition. FIG. 4 indicates the transition metal layer at 17 and the diffusible metal layer at 18. The transition metal layer 17 was of chromium, and the diffusible metal layer 18 was of gold, the latter being diffusible into the gallium-based n-type cladding 11 via the transition metal layer. The transition metal layer 17 was 10 to 500 angstroms thick, and the diffusible meal layer 18 was 200 to 10,000 angstroms thick.

Then the article of FIG. 4 was annealed at 300° C., a temperature less than the eutectic point (345° C.) of gallium contained in the n-type cladding 11 and gold of the diffusible metal layer 18. This treatment caused gold to diffuse from the diffusible metal layer 18 into the n-type cladding 11 via the transition metal layer 17, resulting in the fabrication of the open-worked ohmic contact layer of Ga—Au alloy as at 4 in FIG. 5.

The annealing of the FIG. 4 article should be conducted at such a temperature, and for such a length of time, that the resulting ohmic contact layer 4 is from 20 to 1000 angstroms thick. The annealing temperature in particular should be less than the eutectic point of gallium and gold in order to provide an ohmic contact layer of sufficiently small but uniform thickness and low resistance.

In order to ascertain desirable temperatures of the above annealing, a set of LEDs according to the invention were manufactured by creating the open-worked ohmic contact layer 4 at a series of different annealing temperatures. The combined reflectivity of the ohmic contact layer 4 and reflective metal layer 5 of these LEDs were then measured for red light with a wavelength of 650 nanometers. The results were as represented by the curve A in the graph of FIG. 9. Another set of LEDs according to the prior art were made by creating the noted Au—Ge—Ga ohmic contact layer by annealing at the same series of different temperatures. The combined reflectivity of the ohmic contact layer and reflective metal layer of these prior art LEDs was then measured for the red light of the same wavelength. The curve B represents the results.

Figure 9:
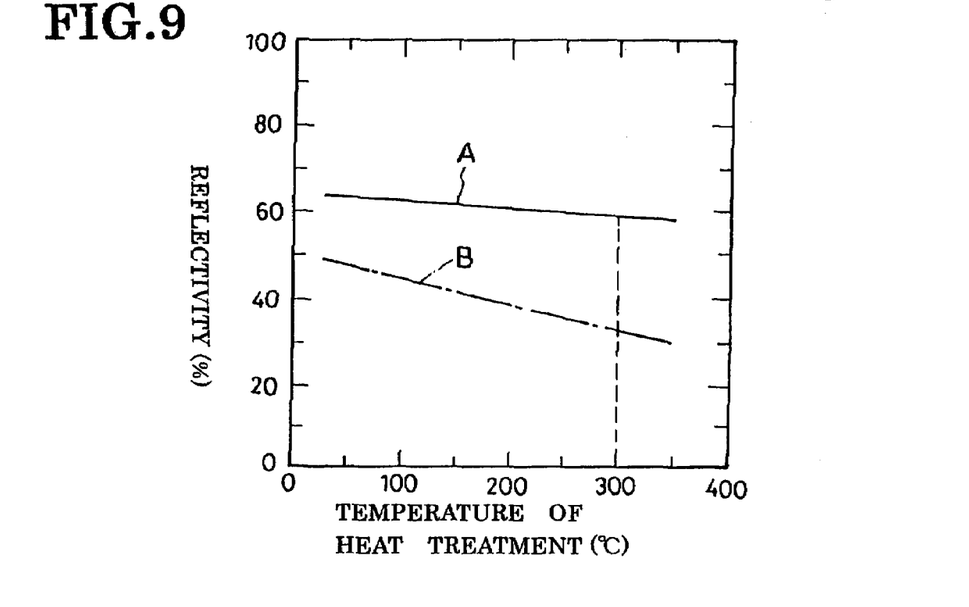
FIG. 9 is a graph plotting the relationship between the reflectivity of the LED according to the invention and the temperature of the heat treatment for creation of the ohmic contact layer, as compared with the same relationship according to the prior art.

Attention may be paid to the fact that the reflectivity of the prior art LED with the Au—Ge—Ga ohmic contact layer created at the annealing temperature of 300° C. is approximately 30 percent. Contrastively, the reflectivity of the inventive LED with the germanium-free ohmic contact layer created at the same annealing temperature is approximately 60 percent, a 30-percentage-point increase over the prior art.

The same graph further demonstrates that the reflectivity is inversely proportional to the annealing temperature. However, the contact resistance between ohmic contact layer 4 and n-type cladding 11 would become inconveniently high if the annealing temperature were set too low. The annealing temperature should therefore be from 250° to 340° C., preferably from 290° to 330° C., in order to keep the contact resistance not more than $2 \times 10^{-4}$ ohm-cm$^{-2}$.

With reference back to FIG. 5 the transition metal layer 17 serves the purpose of decomposing the AlGaInP of the n-type cladding 11 into the individual elements at the time of the heat treatment, imparting greater mobility to these elements, and of cleansing the surface of the n-type cladding. Thus, with the aid of the transition metal layer 17, gold is enabled to diffuse into the n-type cladding 11 by annealing at a temperature less than the eutectic point of gallium and gold, resulting in the fabrication of an extremely thin, open-worked ohmic contact layer 4 made from an alloy or mixture of gallium and gold.

Figure 5:
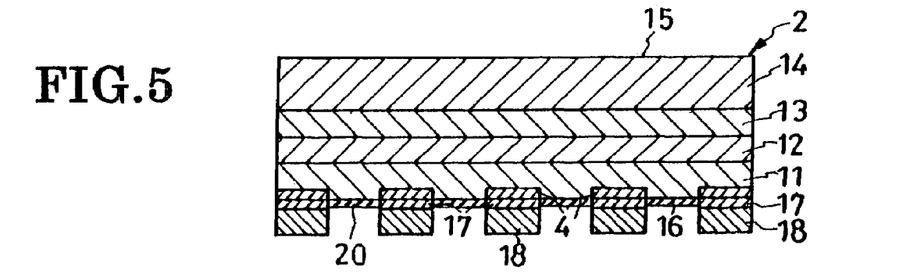
FIG. 5 is a view similar to FIG. 4 but additionally showing the ohmic contact regions formed in the light-generating semiconductor region by thermal diffusion of the diffusible metal through the transition metal layer.
Figure 6:
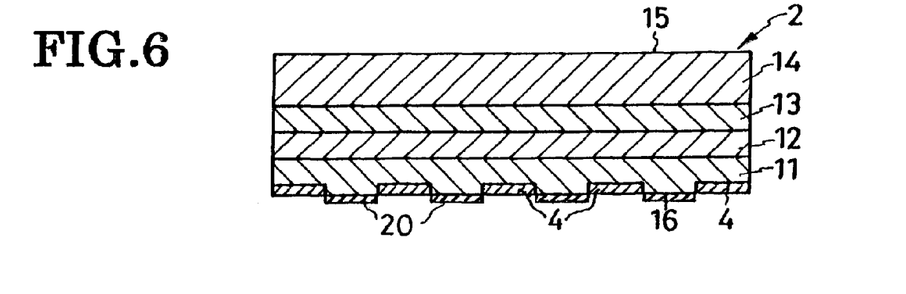
FIG. 6 is a view similar to FIG. 5 except that the transition metal layer and diffusible metal layer of FIGS. 4 and 5 are not shown, having been removed upon creation of the ohmic contact regions as in FIG. 5.

Then the transition metal layer 17 and diffusible metal layer 18 were both etched away from the FIG. 5 article. There was thus obtained as in FIG. 6 the light-generating semiconductor region 2 complete with the ohmic contact layer 4 and anti-alloying layer 20. Fabricated as above according to the novel concepts of this invention, the Au—Ga ohmic contact layer 4 is far better in surface morphology than the prior art Au—Ge—Ga ohmic contact layer which results from heat treatment at a temperature above the eutectic point of gallium and gold. The major surface 16 of the light-generating semiconductor region 2, inclusive of the open-worked ohmic contact layer 4 thereon, is therefore highly favorable in flatness.

Figure 7:
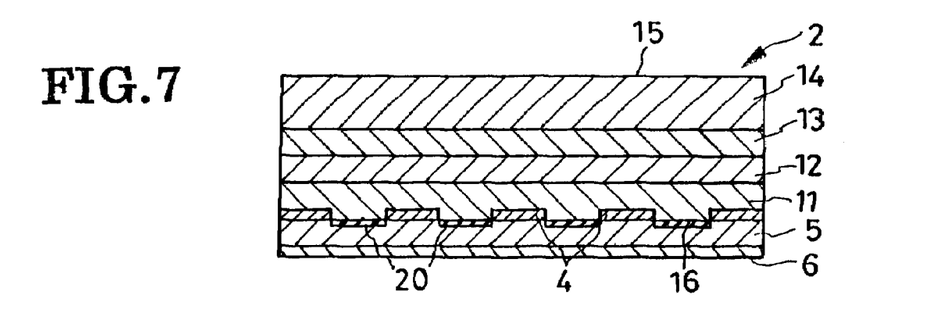
FIG. 7 is a view similar to FIG. 6 but additionally showing the reflective metal layer and a bonding metal layer subsequently formed on the FIG. 6 article.

Then, as seen in FIG. 7, the reflective metal layer 5 was formed on the major surface 16 of the light-generating semiconductor region 2 by vacuum deposition of aluminum to a thickness of one to ten micrometers. The aluminum deposit was heated for a brief period of time using an infrared lamp. The reflective metal layer 5 was thus ohmically joined to the ohmic contact layer 4 and to the anti-alloying layer 20. The forward current of the LED will not flow from the anti-alloying layer toward reflective metal layer 5 as the reflective metal layer 5 of aluminum is joined to the n-type cladding 11 via the anti-alloying layer 20 of insulating material. The reflective metal layer 5 is also favorable in flatness thanks to the improved surface morphology of the ohmic contact layer 4.

Then, as indicated also in FIG. 7, the bonding metal layer 6 was formed on the exposed surface of the reflective metal layer 5. Vacuum deposition of gold was employed to this end.

Figure 8:
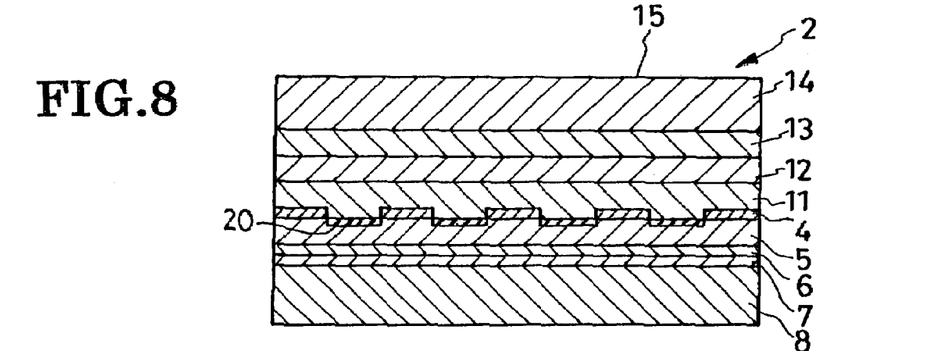
FIG. 8 is a view similar to FIG. 7 but additionally showing the electroconductive silicon baseplate bonded to the FIG. 7 article.

Then another bonding metal layer 7 was formed, also by vacuum deposition of gold, on one of the opposite major surfaces of the electroconductive baseplate 8, FIGS. 1 and 8, of doped silicon. Then the baseplate 8 was bonded to the light-generating semiconductor region 2 by holding the bonding metal layers 6 and 7 against each other under pressure and heating them to a temperature not exceeding 300° C. The light-generating semiconductor region 2 and baseplate 8 were thus integrally combined by the mutual diffusion of gold.

Then, with reference back to FIG. 1, the current-blocking layer 10 and anode 3 were conventionally formed one after the other on the major surface 15 of the light-generating semiconductor region 2. The cathode 9 was conventionally formed on the underside of the baseplate 8. The fabrication of the LED 1 was now completed.

The advantages gained by this particular embodiment of the invention may be recapitulated as follows:

1. Interposed between light-generating semiconductor region 2 and reflective metal layer 5, the electrically insulating, open-worked light transmissive layer 20 prevents the alloying of the metals in the region 2 and layer 5 from various heat treatments during the manufacture of the LED. A drop in the reflectivity of the reflective metal layer 5 due to such alloying is thus precluded. The LEDs manufactured according to the invention are infallibly to emit light with the high efficiency that has been precalculated on the basis of the inherent reflectivity of the reflective metal layer 5.

2. The overall reflectivity of the open-worked ohmic contact layer 4 and reflective metal layer 5 is as high as 60 percent as a result of its germanium-free composition and reduced thickness. A greater percentage than heretofore of the light radiated toward the reflective metal layer 5 from the active layer 12 is sent back toward the light-emitting surface 15 of the semiconductor region 2, contributing to improvement in the efficiency of the LED.

3. The above improved overall reflectivity of the ohmic contact layer 4 and reflective metal layer 5 makes it possible for the ohmic contact layer to occupy a greater percentage then heretofore of the major surface 16 of the light-generating semiconductor region 2 for a given output light intensity. The greater surface area of the ohmic contact layer 4 exposed at the major surface 16 of the semiconductor region 2 leads to a drop in the forward resistance of the LED 1, a less forward voltage drop and power loss, and a higher efficiency of light emission. The maximum efficiency of the red LED manufactured according to the invention as above was 47 lumens per watt at a current density of 40 amperes per square centimeter.

4. The Au—Ga ohmic contact layer 4 is formed at a temperature less than the eutectic point of these elements as gold is diffused from the diffusible metal layer 18 into the n-type cladding 11 via the transition metal layer 17.

5. The electroconductive silicon baseplate 8 can be firmly bonded to the light-generating semiconductor region 2 thanks to the improved surface morphology of the ohmic contact layer 4.

Figure 10:
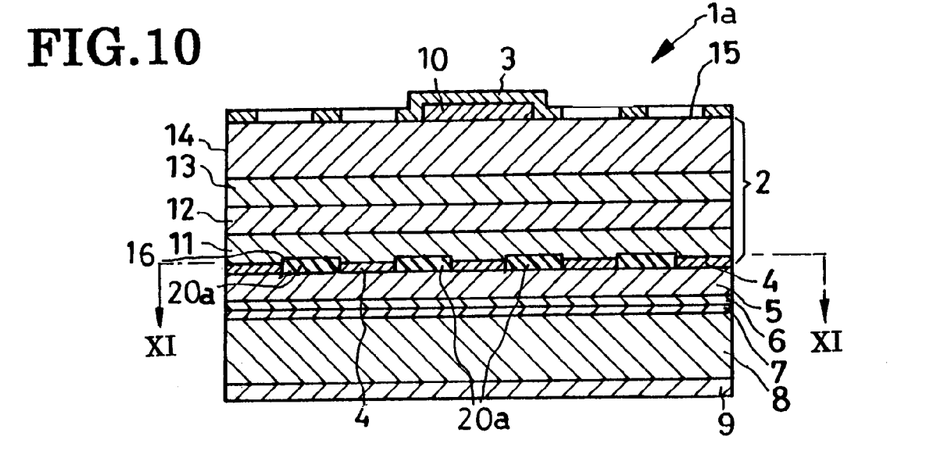
FIG. 10 is a view similar to FIG. 1 but showing an alternate form of LED according to the invention.
Figure 11:
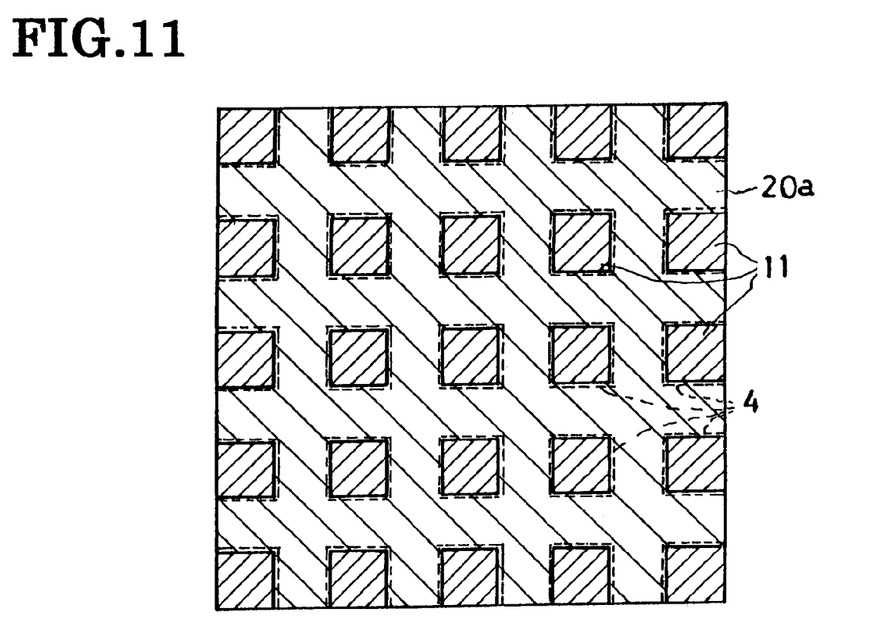
FIG. 11 is a section taken along the line XI-XI in FIG. 10.

Embodiment of FIGS. 10 and 11

The modified LED 1$_a$ of FIGS. 10 and 11 features a latticed or otherwise open-worked anti-alloying layer 20$_a$ of different arrangement from its counterpart 20 of the previous embodiment with respect to the n-type cladding 11. The modified LED 1$_a$ is similar in all the other details of construction to the first disclosed LED 1.

Made from electrically insulating material, the anti-alloying layer 20$_a$ is received in part in a latticed depression cut in the surface of the n-type cladding 11. The rest of the anti-alloying layer 20$_a$ projects from the latticed depression into coplanar relationship with the open-worked ohmic contact layer 4. The modified LED 1$_a$ gains the same advantages as does the LED 1.

Possible Modifications

Although the light-emitting semiconductor device according to the present invention has been shown and described hereinbefore in terms of some currently preferred forms, it is not desired that the invention be limited by the exact details of these preferred forms or by the description thereof. The following is a brief list of possible modifications of the illustrated embodiments which are all believed to fall within the purview of the instant invention:

1. The silicon baseplate 8 is unnecessary in cases where the light-generating semiconductor region 2 itself is sufficiently strong mechanically. The reflective metal layer 8 will then serve as cathode.

2. The open-worked ohmic contact layer 4 could be an array of discrete regions of circular or other shape instead of the rectangular shape shown. It could even be latticed or striped. A latticed ohmic contact layer might be employed in combination with a anti-alloying layer in the form an array of discrete regions.

3. An n-type AlGaInP contact layer and/or n-type buffer layer could be provided between ohmic contact layer 4 and n-type cladding 11 and/or between n-type cladding 11 and anti-alloying layer 20.

4. The ohmic contact layer 4 could be of AuGa or other material instead of AuGeGa, provided that such different material is sufficiently transparent. Its thickness may then be limited to the range of 20 to 1000 angstroms. The overall reflectivity of the ohmic contact layer 4 and reflective metal layer 5 will then be sufficiently high to contribute to appreciable improvement in the efficiency of the LED.

5. The gold layer 19 may be of some other metal capable of alloying with gallium.

6. A metal-made baseplate could be adopted in lieu of the silicon baseplate 8.

7. The transition metal layer 17 could be made from a metal or metals other than chromium, such as one or more of titanium, nickel, scandium, vanadium, manganese, iron, cobalt, cupper, zinc, beryllium, and derivatives thereof. The transition metal layer 17 could also be a lamination of a gold sublayer, chromium sublayer, and another gold sublayer, that of a chromium sublayer, nickel sublayer, and gold sublayer, or that of a chromium sublayer, gold—silicon alloy sublayer, and gold sublayer.

What is claimed is:

1. A light-emitting semiconductor device of improved efficiency, comprising:

(a) a light-generating semiconductor region comprising a plurality of compound semiconductor layers for generating light, the light-generating semiconductor region having a first major surface from which is emitted the light, and a second major surface opposite to the first major surface, the light-generating semiconductor region having a gallium-based compound semiconductor layer which is exposed at the second major surface of the light-generating semiconductor region;

(b) an electrode on the first major surface of the light-generating semiconductor region;

(c) an ohmic contact layer formed on part of the second major surface of the light-generating semiconductor region in ohmic contact therewith, the ohmic contact layer being of an alloy of gallium and another metal, and the alloy being free from germanium;

(d) a reflective metal layer covering the second major surface of the light-generating semiconductor region via the ohmic contact layer for reflecting the light from the light-generating semiconductor region toward the first major surface thereof; and (e) a transparent anti-alloying layer interposed between the light-generating semiconductor region and the reflective metal layer so as to cover at least part of that part of the second major surface of the light-generating semiconductor region which is left exposed by the ohmic contact layer, in order to prevent the alloying of the light-generating semiconductor region and the reflective metal layer;

(f) whereby a greater percentage of the light from the light-generating semiconductor region is reflected by the reflective metal layer for emission from the first major surface of the light-generating semiconductor region than in the absence of the anti-alloying layer.

2. A light-emitting semiconductor device as defined in claim 1, wherein the anti-alloying layer is of electrically insulating material.

3. A light-emitting semiconductor device as defined in claim 1, wherein the anti-alloying layer is made from at least one inorganic oxide selected from among SiO2, SiO, MgO, In2O3, ZrO2, SnO2, Al2O3, TiO2, ZnO, and TaO, or from transparent polyimide resin.

4. A light-emitting semiconductor device as defined in claim 1, wherein the anti-alloying layer is from about three nanometers to one micrometer thick.

5. A light-emitting semiconductor device as defined in claim 1, wherein the anti-alloying layer has a thickness chosen to provide a quantum-mechanical tunnel effect.

6. A light-emitting semiconductor device as defined in claim 1, wherein the ohmic contact layer is in the form of an array of discrete regions.

7. A light-emitting semiconductor device as defined in claim 1, wherein the ohmic contact layer is lattice shaped.

8. A light-emitting semiconductor device as defined in claim 1, wherein the gallium-based compound semiconductor layer of the light-generating semiconductor region is made from, in addition to a conductivity type determinant, any of Group III-V compound semiconductors that are generally defined as:

$$Al_xGa_yIn_{1-x-y}P$$

wherein the subscript x is a numeral that is equal to or greater than zero and less than one; the subscript y is a numeral that is greater than zero and equal to or less than one; and the sum of x and y is greater than zero and equal to or less than one.

9. A light-emitting semiconductor device as defined in 1, wherein the reflective metal layer is higher in reflectivity than the ohmic contact layer.

10. A light-emitting semiconductor device as defined in claim 9, wherein the reflective metal layer is made from aluminum.

11. A light-emitting semiconductor device as defined in claim 1, furthercomprising a baseplate of electroconductive material joined to the reflective metal layer.

12. A light-emitting semiconductor device as defined in claim 11, wherein the baseplate is of doped silicon, and wherein the device further comprises a second electrode joined to the baseplate.

* * * * *